(12) United States Patent
Yan et al.

(10) Patent No.: US 8,417,750 B2
(45) Date of Patent: Apr. 9, 2013

(54) FILTERS FOR COMMUNICATION SYSTEMS

(75) Inventors: Aiguo Yan, North Andover, MA (US); Ayman Shabra, Woburn, MA (US)

(73) Assignee: MediaTek Inc., Hsin-Chu (TW)

( * ) Notice: Subject to any disclaimer, the term of this patent is extended or adjusted under 35 U.S.C. 154(b) by 1170 days.

(21) Appl. No.: 11/249,930

(22) Filed: Oct. 13, 2005

(65) Prior Publication Data

US 2006/0083297 A1  Apr. 20, 2006

Related U.S. Application Data (60) Provisional application No. 60/618,430, filed on Oct. 13, 2004.

(51) Int. Cl.
*G06F 17/17* (2006.01)
(52) U.S. Cl. .......... 708/313; 700/300; 375/232
(58) Field of Classification Search .......... None
See application file for complete search history.

(56) References Cited

U.S. PATENT DOCUMENTS

| | | | | |
|---|---|---|---|---|
| 4,020,332 A * | 4/1977 | Crochiere et al. | ............ | 708/290 |
| 4,847,880 A * | 7/1989 | Kamerman et al. | .......... | 375/222 |
| 4,881,191 A * | 11/1989 | Morton | .......... | 708/316 |
| 5,111,417 A * | 5/1992 | Belloc et al. | .......... | 708/313 |
| 5,220,557 A | 6/1993 | Kelley | | |
| 5,574,399 A | 11/1996 | Oura et al. | | |
| 5,646,621 A | 7/1997 | Cabler et al. | | |
| 5,987,061 A * | 11/1999 | Chen | .......... | 375/222 |
| 6,038,267 A | 3/2000 | Oura et al. | | |
| 6,038,272 A | 3/2000 | Golden et al. | | |
| 6,226,322 B1 * | 5/2001 | Mukherjee | .......... | 375/229 |

(Continued)

FOREIGN PATENT DOCUMENTS

| | | |
|---|---|---|
| EP | 0 973 271 A1 | 1/2000 |
| EP | 1 067 688 A2 | 1/2001 |

(Continued)

OTHER PUBLICATIONS

Kuphaldt; Mar. 8, 2003; "Lessons in Electric Circuits, vol. II—AC"; Chapter 8; URL:http://www.faqs.org/docs/electric/AC/AC_8.html.*

(Continued)

*Primary Examiner* — Michael D Yaary
(74) *Attorney, Agent, or Firm* — Fish & Richardson P.C.

(57) ABSTRACT

The invention relates to a cascaded scheme in which an RRC filter, a modified RRC filter or other digital filter is implemented at a relatively low data rate, such as twice the symbol or chip rate, or 2x. Interpolation filters are used to increase the data rate to a higher data rate, such as 8x. Decimation filters are used to reduce the data rate from a higher rate, such as 8x, to a lower rate, such as 2x. The coefficients of the digital filter may be adjusted to compensate for characteristics of other components across the entire filter chain. Most of the implementation complexity of the filter chain is consolidated into the relatively low rate (such as 2x) digital filter while interpolation or decimation filters can be implemented at very low cost. The compensation capability provided by the digital filter makes design of simple decimation or interpolation filters much easier. The compensation capability provided by the digital filter, along with the relatively high over-sampling rate for the output of the interpolation filter (or the input of the decimation filter), also makes the design of the preceding (or following) analog filters much easier.

46 Claims, 5 Drawing Sheets

U.S. PATENT DOCUMENTS

| | | |
|---|---|---|
| 6,314,287 B1 | 11/2001 | Leickel et al. |
| 6,487,410 B1 | 11/2002 | Kontio et al. |
| 6,690,946 B1 | 2/2004 | Ismert et al. |
| 6,859,488 B2 | 2/2005 | Azenkot et al. |
| 6,999,527 B2 | 2/2006 | Chen |
| 7,010,280 B1 | 3/2006 | Wilson |
| 7,046,987 B2 | 5/2006 | Siegel et al. |
| 7,095,803 B2 | 8/2006 | Gazsi et al. |
| 7,136,432 B2 | 11/2006 | Min et al. |
| 7,149,491 B2 | 12/2006 | Kawai et al. |
| 7,272,125 B2 | 9/2007 | Hokao |
| 2002/0067757 A1* | 6/2002 | Philips et al. ............... 375/130 |
| 2002/0097703 A1* | 7/2002 | Nieczyporowicz et al. .. 370/342 |
| 2003/0016770 A1* | 1/2003 | Trans et al. ............... 375/346 |
| 2003/0021365 A1 | 1/2003 | Min et al. |
| 2003/0031274 A1 | 2/2003 | Chen |
| 2003/0078037 A1 | 4/2003 | Auckland et al. |
| 2003/0100994 A1* | 5/2003 | Strickland et al. ............... 702/7 |
| 2003/0137322 A1* | 7/2003 | Vorenkamp ............... 326/62 |
| 2003/0177156 A1* | 9/2003 | Van Der Valk et al. ....... 708/313 |
| 2004/0037363 A1 | 2/2004 | Norsworthy et al. |
| 2004/0037366 A1 | 2/2004 | Crawford |
| 2005/0181822 A1 | 8/2005 | Sasaki et al. |
| 2005/0239500 A1 | 10/2005 | Liu et al. |
| 2005/0250514 A1 | 11/2005 | Chen et al. |
| 2005/0277436 A1 | 12/2005 | Lai et al. |
| 2006/0029171 A1 | 2/2006 | Jensen |
| 2006/0030354 A1 | 2/2006 | Ho et al. |
| 2006/0077893 A1 | 4/2006 | Yan |
| 2006/0078068 A1 | 4/2006 | Yan |
| 2006/0079272 A1 | 4/2006 | Yan |

FOREIGN PATENT DOCUMENTS

| | | |
|---|---|---|
| JP | 1265713 | 10/1989 |
| JP | 2216907 | 8/1990 |
| JP | 3065813 | 3/1991 |
| JP | 5075394 | 3/1993 |
| JP | 6181475 | 6/1994 |
| JP | 6204944 | 7/1994 |
| JP | 10051269 | 2/1998 |
| JP | 10075272 | 3/1998 |
| JP | 10200412 | 7/1998 |
| JP | 10257113 | 9/1998 |
| JP | 11041305 | 2/1999 |
| JP | 11055077 | 2/1999 |
| JP | 11122551 | 4/1999 |
| JP | 11317778 | 11/1999 |
| JP | 2001119270 | 4/2001 |
| JP | 2001257653 | 9/2001 |
| JP | 2002500462 | 1/2002 |
| JP | 2002291078 | 10/2002 |
| JP | 2002368543 | 12/2002 |
| JP | 2003051793 | 2/2003 |
| JP | 2004193951 | 7/2004 |
| WO | WO 00/31885 A1 | 6/2000 |
| WO | WO 00/65799 A1 | 11/2000 |
| WO | WO 02/01726 A2 | 1/2002 |
| WO | WO 03/073631 A1 | 9/2003 |

OTHER PUBLICATIONS

Iowegian Internation Corporation; Sep. 2, 1999; "Raised Cosine FIR Filter Design"; URL:http://web.archive.org/web/19990902220530/http://iowegian.com/rcfilt.htm.*

Netravali et al.; 1995; "Digital pictures: representation, compression, and standards"; Plenum Press; p. 321; URL: http://books.google.com/books?id=-TXYfZrCBuQC&pg=PA321&PA321&lpg=PA321#v=onepage&q=&f=false.*

Reid; May 20, 2002; "Software Radio: A Modern Approach to Radio Engineering"; Prentice Hall; Ch. 3 Section 2; URL: http://proquest.safaribooksonline.com/0130811580/ch03lev1sec2.*

Analog Devices, Inc.; "AD6620—65 MSPS Digital Receive Signal Processor"; 1998; URL:http://download.siliconexpert.com/pdfs/2004/08/25/semi_ap/manual/adi/digital%20up-down%20converters/688917820ad6636_0.pdf.*

Texas Instruments; "GC4116 Multi-Standard Quad Duc Chip Data Sheet"; Jun. 2002; URL:http://www.datasheetcatalog.org/datasheet/texasinstruments/gc4116.pdf.*

Lee; "An FPGA Prototype for a Multiplierless FIR Filter Built Using the Logarithmic Number System"; 1995; URL: http://www.springerlink.com/content/f050t1u0665q5255/.*

Jung et al.; "Implementation of Digital Transceiver for Multiple CDMA Signals"; Jul. 25, 2003; URL:http://www.springerlink.com/content/323lcy93e7mt1kyh/.*

Hogenauer; "An Economical Class of Digital Filters for Decimation and Interpolation"; Apr. 1981; URL:http://ieeexplore.ieee.org/xpls/abs_all.jsp?arnumber=1163535.*

Dondadio; "CIC Filter Introduction"; Jul. 18, 2000; URL:http://www.mikrocontroller.net/attachment/51932/cic2.pdf.*

Xilinx, Inc.; "Cascaded Integrator-Comb (CIC) Filter v3.0"; Date: Mar. 14, 2002; URL:http://citeseerx.ist.psu.edu/viewdoc/summary?doi=10.1.1.113.5618.*

Hazanchuk et al.; "Optimizing Up/Down Conversion with FPGA Techniques"; Dec. 23, 2003; URL:http://www.eetimes.com/design/programmable-logic/4009269/Optimizing-Up-Down-Conversion-with-FPGA-Techniques.*

Zangi et al.; "Software Radio Issues in Cellular Base Stations"; Apr. 1999; URL:http://ieeexplore.ieee.org/xpls/abs_all.jsp?arnumber=761036&tag=1.*

Wymeersch et al.; "Multi-rate receivers with IF sampling and digital timing correction";Aug. 19, 2004; URL:http://www.sciencedirect.com/science/article/B6V18-4D4CW45-3/2/6a1bce4a2aba8e30f0f66545edc5797e.*

Nova Engineering, Inc.; "Digital IF Receiver Megafunction—Data Sheet (PN F901SC)"; Date: Dec. 2001; URL:http://www.nova-eng.com/downloads/ip_digifrec.pdf.*

Nova Engineering, Inc.; "Digital IF Receiver"; Apr. 4, 2003; URL:http://web.archive.org/web/20030404203709/http://www.altera.com/products/ip/dsp/additional_functions_dsp/m-nov-dig-if-rec.html.*

Hogenauer E.B., "An Economical Class of Digital Filters for Decimation and Interpolation", IEEE Transactions on Acoustics, Speech and Signal Processing, Apr. 1, 1981, pp. 155-162, vol. 29, No. 2, IEEE Inc. New York, USA.

B. Sklar, "Digital Communications. Fundamentals and Applications", Bandpass Modulation and Demodulation, Chap. 4, 2001, pp. 194, 211-212, XP-002367099, Prentice Hall.

Uehara K. et al., "Design and Performance Evaluation of Software Defined Radio Prototype for PHS and IEEE802.11 Wireless LAN", Personal, Indoor and Mobile Radio Communications, 2002. The 13th IEEE International Symposium on Sep. 15-18, 2002, Piscataway, NJ, USA, IEEE, vol. 1, Sep. 15, 2002, pp. 452-457, XP010614266.

Uusikartano R. et al., "A low-power fractional decimator architecture for an IF-sampling dual-mode receiver", Circuits and Systems, 2004. ISCAS '04. Proceedings of the 2004 International Symposium on Vancouver, BC, Canada May 23-26, 2004, Piscataway, NJ, USA, IEEE, US, May 23, 2004, pp. III-589 to III-592, XP010719345.

Search Report dated Feb. 16, 2006 from International Application No. PCT/US2005/036946.

Search Report dated Feb. 27, 2006 from International Application No. PCT/US2005/036941.

Search Report dated Feb. 24, 2006 from International Application No. PCT/US2005/037090.

Search Report dated Jan. 25, 2006 from International Application No. PCT/US2005/036944.

Office Action dated Nov. 20, 2006 from U.S. Appl. No. 10/964,576.
Office Action dated Sep. 20, 2007 from U.S. Appl. No. 10/964,576.
Office Action dated Sep. 27, 2007 from U.S. Appl. No. 10/964,597.
Office Action dated Nov. 2, 2007 from U.S. Appl. No. 10/964,570.

Litchfield, et al.; "The Use of Hybrid Logarithmic Arithmetic for Root Raised Cosine Matched Filters in WCDMA downlink Receivers"; Wireless Communications and Networking Conference, IEEE, Mar. 13-17, 2005; vol. 1, pp. 596-600.

Weilang, et al.; "Design and FPGA implementation of high-speed square-root-raised-cosine FIR filters"; Proc. 2002 IEEE 10th Digital Signal Processing Workshop and the 2nd Signal Processing education Workshop; Oct. 13-16, 2002; pp. 232-235.

Yao; "The Design of a Square-Root-Raised-Cosine FIR Filter by a Recursive Method"; IEEE International Symposium on Circuits and Systems, May 23-26, 2005; pp. 512-515.

Office Action issued by the Japanese Patent Office on May 29, 2012 for Application No. 2007-536922; 3 pages.

* cited by examiner (PRIOR ART)
FIG. 1

FILTERS FOR COMMUNICATION SYSTEMS

CROSS REFERENCE TO THE RELATED APPLICATION

This application claims priority based on provisional application Ser. No. 60/618,430, filed Oct. 13, 2004, which is hereby incorporated by reference in its entirety.

FIELD OF THE INVENTION

This invention relates to filters for communication systems and, more particularly, to filters which enable one or more of advantageous digital/analog partitioning, simplification of analog filter design, optimization of the entire filter chain performance across multiple ICs (integrated circuits), reduction of data traffic between ICs, and reduction of power consumption and silicon area using multi-rate techniques in comparison with conventional configurations. The invention may be utilized for pulse shaping filters in wireless communication systems, but is not limited to such applications.

BACKGROUND OF THE INVENTION

Root-Raised-Cosine (RRC) filters are widely used for the purpose of pulse shaping in many wireless communication systems, such as WCDMA, TDSCDMA, CDMA2000, IS136, PDC and PHS. In these communication systems, the RRC filters are utilized in both transmitters and receivers. Such filters, preferably implemented in the digital domain, typically utilize a sampling rate that is a multiple of the symbol rate or chip rate of the wireless communication system, either to facilitate removal of the image spectrum in the analog domain in the case of transmitters or to ease the design of the analog anti-aliasing filter in the case of receivers. Thus, for example, the filter sampling rate may be eight times (8×) the symbol (or chip) rate of the signal being filtered. As used herein, the notation "8×" expresses the sampling rate as a multiple of the signal symbol (or chip) rate.

Figure 1:
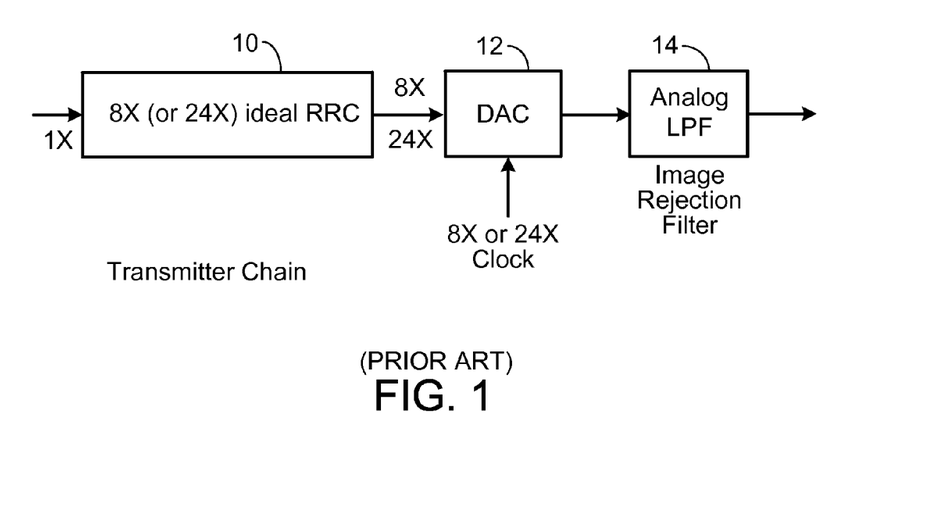
FIG. 1 is a block diagram of a prior art direct implementation of a transmitter chain.

A block diagram of a conventional transmitter chain is shown in FIG. 1. The signal to be filtered at a 1× data rate is supplied to an 8× RRC digital filter 10. The output of 8× digital filter 10 is supplied to a digital-to-analog converter (DAC) 12. The output of DAC 12 is supplied an analog low pass filter 14 which performs image rejection. In other embodiments, a 24× RRC digital filter is utilized.

Figure 2:
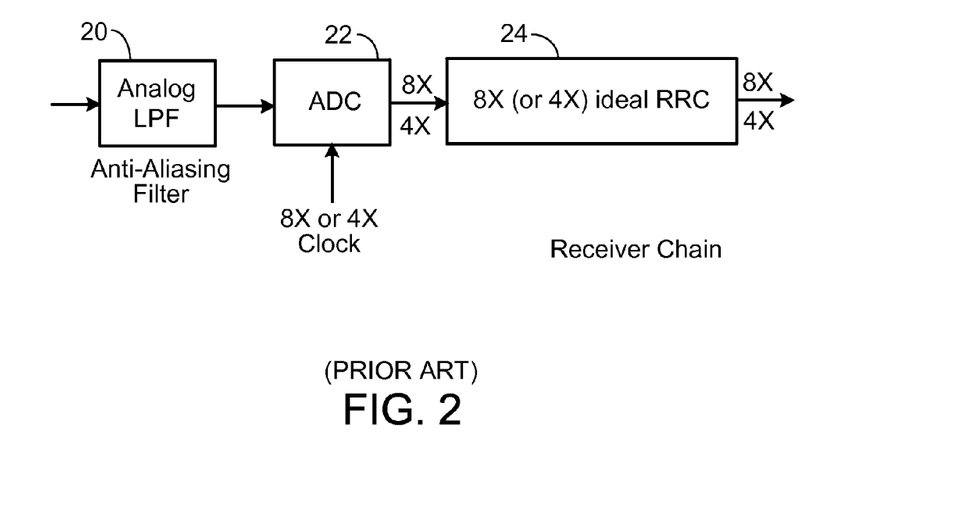
FIG. 2 is a block diagram of a prior art direct implementation of a receiver chain.

A block diagram of a conventional receiver chain is shown in FIG. 2. The analog signal to be filtered is input to an anti-aliasing filter implemented as an analog low pass filter 20. The output of filter 20 is supplied to an analog-to-digital converter (ADC) 22 which samples the analog signal at an 8× sampling rate. The 8× signal is supplied to an 8× RRC digital filter 24. In other embodiments, ADC 22 has a 4× sampling rate and/or filter 24 is a 4× RRC digital filter.

Conventional systems have utilized a so-called direct digital implementation, wherein the filter is implemented as a digital filter having the desired sampling rate. Thus, for example, an 8× filter would be implemented as an 8× RRC digital filter. However, such filter implementations require a large number of filter coefficients, since the number of coefficients required is proportional to the sampling rate, and are complex as well. Consequently, such filter implementations consume a relatively large amount of power and silicon area.

According to the sampling theory, a 2× rate (twice the chip or symbol rate) is sufficient for the ADC, the DAC, and the RRC filters. However, such a low over-sampling rate would put very stringent requirements on the analog anti-aliasing (channel selection) filter in the receiver path and the image rejection filter in the transmitter path. Using a higher over-sampling rate, such as an 8× rate, in the RRC filter makes the design of the analog filters much easier.

Accordingly, there is a need for new and improved filter configurations and methods which enable conflicting requirements to be satisfied.

SUMMARY OF THE INVENTION

Each of the receivers and the transmitters is normally built across several ICs physically. When in the digital domain, it is desirable to reduce the data traffic between ICs. The invention enables data to be exchanged between ICs at the minimum 2× rate.

The filters used in receivers and transmitters are scattered across several ICs physically. Traditionally each filter is designed independently, so that there is no overall coordination of filter performance. The invention enables filters to compensate each other so that the overall performance of the entire filter chain is optimized. Controlled performance degradation may be introduced in one filter in order to make the design of that filter much easier. This controlled performance degradation may be compensated by another filter in the chain.

The invention relates to a cascaded scheme in which an RRC filter, a modified RRC filter or other digital filter is implemented at a relatively low data rate, such as twice the symbol (or chip) rate, or 2×. Interpolation filters are used to increase the data rate to a higher data rate, such as 8×. Decimation filters are used to reduce the data rate from a higher rate, such as 8×, to a lower rate, such as 2×.

According to a first aspect of the invention, a filter having an output at a first data rate is provided. The filter comprises a digital filter which operates at a second data rate that is lower than the first data rate; and an interpolation filter connected in series with the digital filter, wherein the interpolation filter increases the data rate from the second data rate to the first data rate.

According to a second aspect of the invention, a method is provided for filtering a signal and providing an output at a first data rate. The method comprises digital filtering the signal in a digital filter at a second data rate that is lower than the first data rate, and interpolation filtering the output of the digital filter in an interpolation filter, wherein the interpolation filter increases the data rate from the second data rate to the first data rate.

According to a third aspect of the invention, a filter having an input at a first data rate is provided. The filter comprises a decimation filter which receives the input at the first data rate and decreases the data rate from the first data rate to a second data rate that is lower than the first data rate; and a digital filter connected in series with the decimation filter, wherein the digital filter operates at the second data rate.

According to a fourth aspect of the invention, a method is provided for filtering an input signal at a first data rate. The method comprises decimation filtering the input signal in a decimation filter, wherein the decimation filter decreases the data rate from the first data rate to a second data rate that is lower than the first data rate; and digital filtering the output of the decimation filter in a digital filter at the second data rate.

BRIEF DESCRIPTION OF THE DRAWINGS

For a better understanding of the present invention, reference is made to the accompanying drawings, which are incorporated herein by reference, and in which.

DETAILED DESCRIPTION

Figure 3:
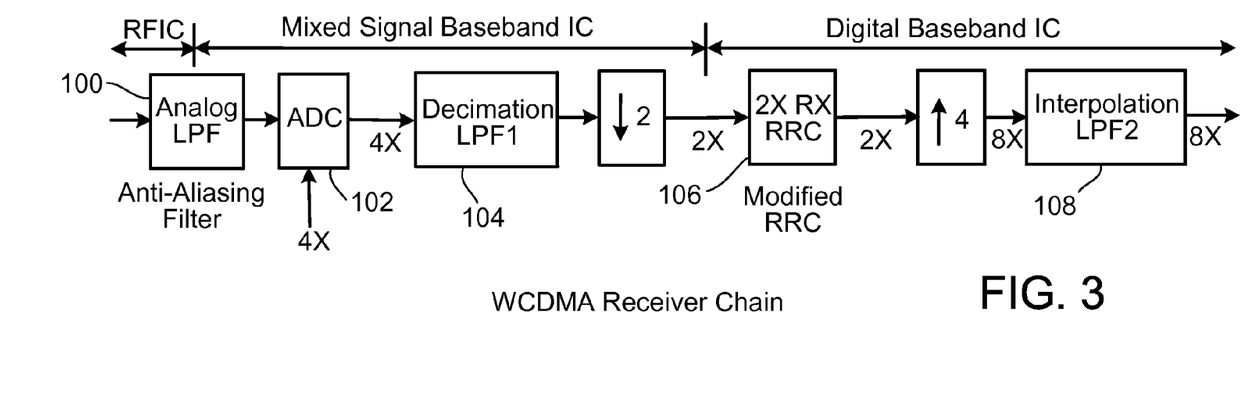
FIG. 3 is a block diagram of a WCDMA receiver chain in accordance with a first embodiment of the invention.

A block diagram of a WCDMA (wideband code division multiple access) receiver chain including a filter in accordance with a first embodiment of the invention is shown in FIG. 3. The receiver chain includes an analog low pass filter 100, an analog-to-digital converter (ADC) 102, a decimation filter 104, a modified RRC digital filter 106 and an interpolation filter 108. The "modified" RRC filter refers to an RRC filter in which the coefficients have been modified to compensate for other components of the entire filter chain as described below. The analog low pass filter 100 is an anti-aliasing filter. The components of the receiver chain are cascaded, or connected in series, to provide and output data rate of 8×. The ADC 102 samples the analog signal at a 4× sampling rate in order to relax the requirement for the analog anti-aliasing filter. Decimation filter 104 may be a low pass filter (LPF) that produces a 2× reduction in data rate. The modified RRC digital filter 106 may be a finite impulse response (FIR) digital filter having a 2× sampling rate. Interpolation filter 108 may be a low pass filter which increases the data rate by 4×. For example, each of decimation filter 104 and interpolation filter 108 may be any low pass filter which can be implemented with low cost. The analog low pass filter 100 may be implemented in a mixed signal baseband (ABB) and/or a radio frequency (RF) integrated circuit. The ADC 102 and the decimation filter 104 may be implemented in a mixed signal baseband (ABB) integrated circuit. The modified RRC digital filter 106 and the interpolation filter 108 may be implemented in a digital baseband (DBB) integrated circuit. As shown, the communication between chips from the decimation filter 104 to the modified RRC digital filter 106 is at a 2× data rate. In the example of a wireless communication system, the output data rate is 8 samples per chip.

In order to reduce the data rate between the ABB and DBB ICs, the decimation filter 104 is used to reduce the data rate from 4× to 2×. The implementation of the decimation filter 104 requires no multiplications.

The modified RRC digital filter 106, a 2× symmetric FIR filter, has a duration of 10 chips for example, meaning 21 taps with a 2× sampling rate. This FIR filter is programmable in order to compensate any unexpected or undesired (but controlled) distortions introduced by other components across the entire filter chain. The objective is to make the frequency response of the entire filter chain as close as possible to the ideal frequency response of the RRC filter. Since the FIR filter is symmetric, only amplitude distortion can be compensated. A simulation shows it is sufficient to only compensate amplitude distortion.

Since the rest of the WCDMA receiver requires an 8× data stream, the 2× output of the modified RRC filter is interpolated to 8× using interpolation filter 108. The implementation of the interpolation filter 108 requires no multiplications. Only the implementation of the modified RRC filter requires multiplications.

Figure 4:
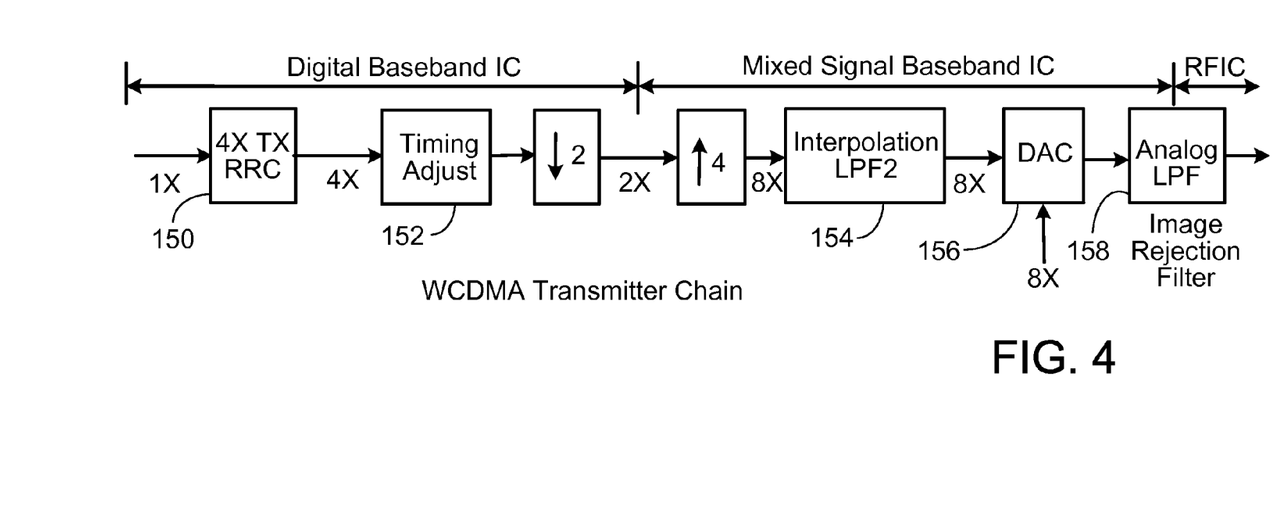
FIG. 4 is a block diagram of a WCDMA transmitter chain in accordance with a second embodiment of the invention.

A block diagram of a WCDMA transmitter chain including a filter in accordance with a second embodiment of the invention is shown in FIG. 4. The transmitter chain, which receives a digital signal at a 1× data rate, includes a 4× modified RRC digital filter 150, a timing adjust block 152, an interpolation filter 154, a digital-to-analog converter (DAC) 156 and an analog low pass filter 158. The output of the modified RRC digital filter 150 is supplied to timing adjust block 152 at a 4× data rate. After the timing adjustment, the data rate is reduced to a 2× rate so that the communication between digital baseband and analog baseband ICs is at the lowest rate (i.e. 2× rate) possible. Interpolation filter 154 increases the data rate from 2× to 8×. The DAC 156 has a sampling rate of 8× and provides an analog signal to analog low pass filter 158, which functions as an image rejection filter. The high sampling rate of 8× with DAC 156 relaxes the requirement for the image rejection analog low pass filter. The modified RRC digital filter 150 and the timing adjust block 152 are implemented in a digital baseband integrated circuit. The interpolation filter 154 and the DAC 156 are implemented in a mixed signal based band integrated circuit. The analog image rejection filter is implemented in a digital baseband integrated circuit or/and a radio frequency integrated circuit. The communication between digital baseband and analog baseband ICs is at the lowest data rate (i.e., a 2× data rate).

Since the requirement for timing adjustment is ±⅛ chip, the input data to the timing adjust block 152 must be at a 4× rate at least. Instead of having a 1×-in-2×-out modified RRC filter followed by another interpolation filter, we use directly a 1×-in-4×-out modified RRC filter here. The reasons for doing so include (1) the simplicity of the design; (2) sufficient resources available for 1×-in-4×-out implementation; (3) power consumption and silicon area are not of concern, just to name a few.

As in the WCDMA receiver, the implementation of the interpolation filter 154 requires no multiplications. Only the implementation of the modified RRC filter requires multiplications.

Figure 5:
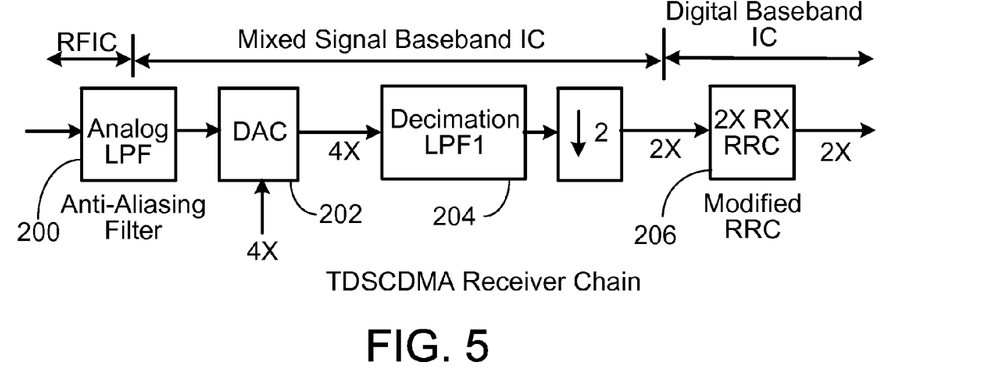
FIG. 5 is a block diagram of a TDSCDMA receiver chain in accordance with a third embodiment of the invention.

A block diagram of a TDSCDMA (time division synchronous code division multiple access) receiver chain including a filter in accordance with a third embodiment of the invention is shown in FIG. 5. The receiver chain includes an analog low pass filter 200, an ADC 202, a decimation filter 204 and a 2× modified RRC digital filter 206. Unlike the WCDMA receiver, no following interpolation filter is required since rest of the TDSCDMA receiver only requires a 2× data stream. The analog low pass filter 200 functions as an anti-aliasing filter. The ADC 202 has a sampling rate of 4× in order to relax the requirement for the analog anti-aliasing filter. The decimation filter 204 receives the output of ADC 202 at a 4× data rate and reduces the data rate to 2×, thereby supplying samples to the modified RRC digital filter 206 at a 2× data rate. The ADC 202 and the decimation filter 204 are implemented in a mixed signal baseband integrated circuit. The modified RRC digital filter 206 is implemented in a digital baseband integrated circuit.

In order to reduce the data rate between the ABB and DBB ICs, decimation filter 204 is used to reduce the data rate from 4× to 2×. The implementation of the decimation filter 204 requires no multiplications. Only the implementation of the modified RRC filter requires multiplications.

In order to minimize the quantization noise, the signal level before the ADC 202 should be adjusted so that the outputs of the ADC 202 have no (or minimum) saturation and are using the full ADC dynamic range. The gain of the decimation filter 204 should be set carefully so that the output of the decimation filter 204 is using full dynamic range provided by the interface. In general, it is very desirable to utilize full dynamic range of the interface, DAC and ADC with no or minimum saturations across the filter chains.

The filter taps for the modified RRC digital filter 206 are derived in such a way to compensate the undesired pass-band amplitude distortion introduced by the anti-aliasing filter 200 and the decimation filter 204, so that the frequency response of the entire filter chain approximates the ideal RRC frequency response as much as possible. The principle described here applies to all modified RRC digital filters.

Figure 6:
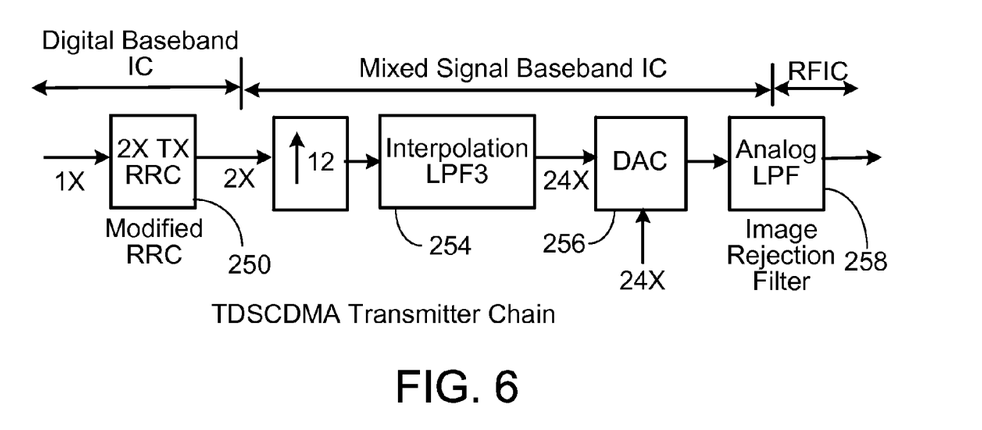
FIG. 6 is a block diagram of a TDSCDMA transmitter chain in accordance with a fourth embodiment of the invention.

A block diagram of a TDSCDMA transmitter chain including a filter in accordance with a fourth embodiment of the invention is shown in FIG. 6. The transmitter chain, which receives a digital input at a 1× data rate, includes a 2× modified RRC digital filter 250, an interpolation filter 254, a DAC 256 and an analog low pass filter 258. The modified RRC digital filter 250 supplies an input to interpolation filter 154 at a 2× data rate. Interpolation filter 154 increases the data rate by a factor of 12 and provides an output at a 24× data rate to DAC 256. The DAC 256 has a 24× sampling rate. Analog low pass filter 258 functions as an image rejection filter. The high sampling rate of 8× with DAC 256 relaxes the requirement for the image rejection analog low pass filter. The modified RRC digital filter 250 is implemented in a digital baseband integrated circuit. Interpolation filter 254 and DAC 256 are implemented in a mixed signal baseband integrated circuit.

The modified RRC digital filter 250 receives inputs at the 1× rate and outputs data at the 2× rate. The I/Q samples are sent from the DBB IC to the ABB IC at the minimum 2× rate.

In the ABB IC, the data stream is up-sampled to a 24× rate using interpolation filter 254 before being sent to the DAC 256. The analog filter 258 (in both ABB and RFIC) after DAC 256 are used to filter the image spectrum.

The interpolation and decimation filters, running at higher data rates, are chosen to be very simple and easy to implement. For example, interpolation and decimation filters that require only addition and subtraction are utilized. Normally, such simple filters introduce undesired (but controlled) attenuation in the passband or other undesired characteristics. However, any distortion caused by these simple filters can be compensated by adjusting the coefficients of the modified RRC filter. The coefficients may be further adjusted in order to compensate for distortion caused by other components such as the DAC and analog filters across the entire receiver or transmitter chain. For example, the analog filter 100 in the WCDMA receiver chain may have too much attenuation in the pass-band of the signal and result in about 0.5 db degradation with BLER (BLock Error Rate) performance. The pass-band attenuation can be compensated by adjusting the coefficients of the modified RRC digital filter 106. The coefficients in the modified RRC digital filters 106, 150, 206 and 250 can be programmable in order to compensate for undesired characteristics introduced in the receiver or transmitter chain. The compensation capability provided by the digital filter makes design of simple decimation or interpolation filters much easier. The compensation capability provided by the digital filter, along with the relatively high over-sampling rate for the output of the interpolation filter (or the input of the decimation filter), also makes the design of the preceding (or following) analog filters much easier.

The entire filter chain may be implemented across different chips which are fabricated using different technologies. In a product for TDSCDMA and WCDMA, the modified RRC filter is implemented in a digital baseband processor which uses more advanced technology, whereas the interpolation filters and the analog filter are implemented in a mixed signal baseband processor which uses less advanced technology. The programmable modified RRC filter is the most complex filter but is fabricated with a more advanced technology. The interpolation filters and the analog filter are less complex and therefore are suitable for less advanced technology, which normally implies large area and more power consumption. The partitioning disclosed herein provides an optimal partition between analog and digital circuits, thereby minimizing silicon area and power consumption but with uncompromised performance. In addition, data are passed between the DBB and ABB processors at a low rate (i.e. 2×) which in turn reduces power consumption further.

Figure 7:
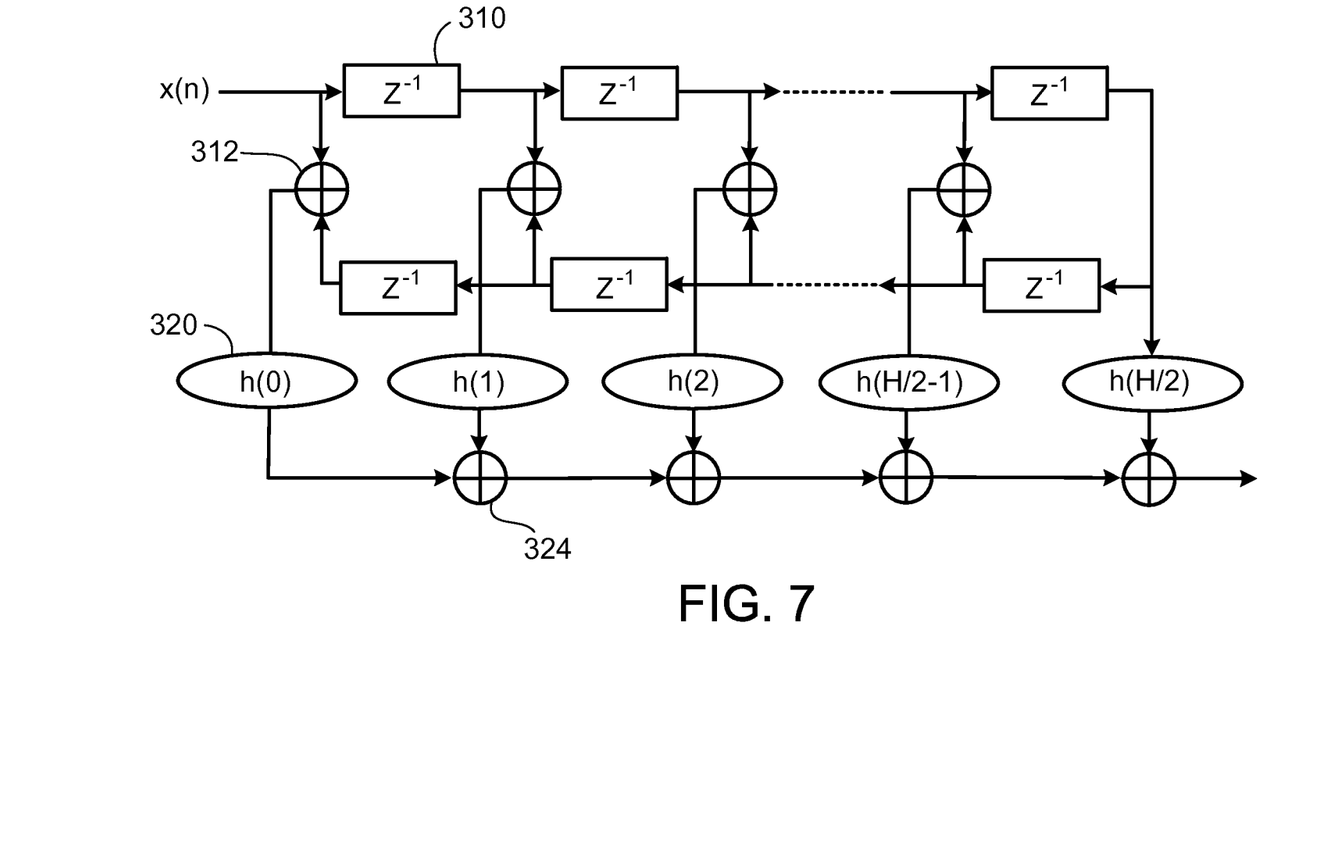
FIG. 7 is a block diagram of a modified RRC digital filter in accordance with a fifth embodiment of the invention.

A block diagram of an embodiment of the modified RRC digital filters is shown in FIG. 7. The digital filter 300 shown in FIG. 7 is an FIR implementation for use with symmetric coefficients [h(0), h(1), . . . , h(H/2−1), h(H/2), h(H/2−1), . . . , h(1), h(0)], where the number of coefficients is an odd number. The filter includes a series of registers 310 for holding data values, adders 312 for summing the data values in registers of each stage, multipliers 320 for multiplying the outputs of adder 312 by the respective coefficients and adders 324 for summing the stage outputs to provide an output value.

One of the major advantages of the proposed filter chain architecture is that we use the programmable modified RRC filter in the DBB IC to compensate any unwanted and unexpected distortion in the filter chain.

Mathematically, we want (using WCDMA receiver chain as an example)

$$H_{Ideal\_RRC}(j2\pi f) \approx H_{Modified\_RRC}(e^{j2\pi f/f_{s2}}) H_{LPF1}(e^{j2\pi f/f_{s3}}) H_{LPF2}(e^{j2\pi f/f_{s4}}) H_{Anti\_Aliasing}(j2\pi f)$$

with sampling rates $f_{s2}=2\times$; $f_{s3}=4\times$; $f_{s4}=8\times$, respectively, since the modified RRC filter is working at a 2× rate, the decimation filter LPF1 at a 4× rate, and the interpolation LPF2 at an 8× rate. In the equation, the modified RRC, LPF1 and LPF2 filters are described with the Fourier transformation in the discrete time domain, whereas the analog anti-aliasing filter and the ideal RRC filter are described with the Fourier transformation in the continuous time domain.

Figure 8:
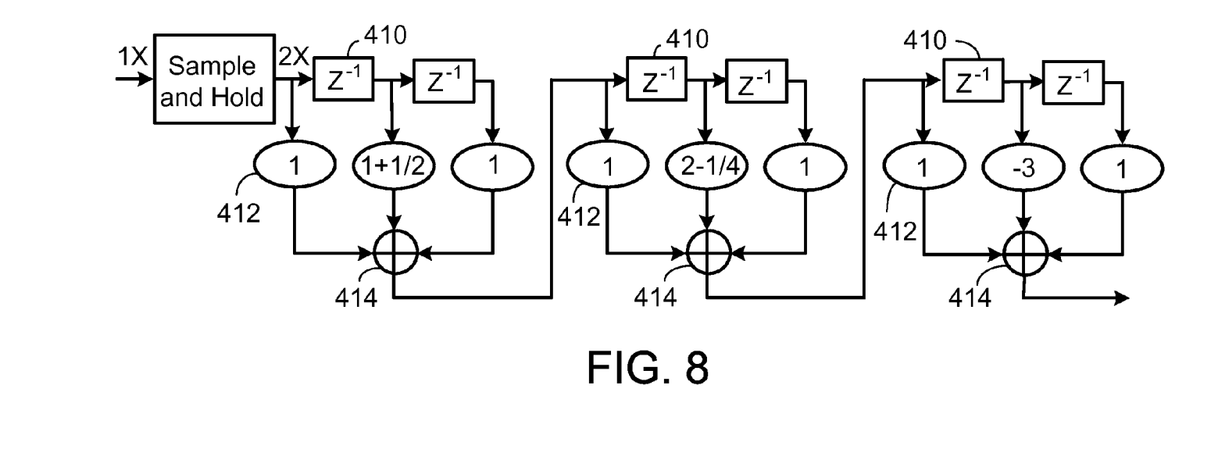
FIG. 8 is a block diagram of a 2× interpolation filter in accordance with a sixth embodiment of the invention.

An example of an implementation of 2× interpolation filters is shown in FIG. 8. As shown, the filter includes registers 410, coefficients 412 and adders 414. This filter includes 4 stages (the "sample and hold" block is the first stage) with each stage's impulse response being [1, 1], [1, 2½, 1], [1, 2¼, 1] and [1, −3, 1] respectively. As one can see, the impulse responses are so simple that the implementation of such a filter requires no multiplications at all, but only additions and subtractions. Specifically, 1*x=x; (2½)*x=x+x/2; (2¼)*x=2*x−x/2/2; 3*x 2*x+x for any number x. In the binary domain, 2*x or x/2 is equivalent to shifting x by one bit toward the left or right.

Figure 9:
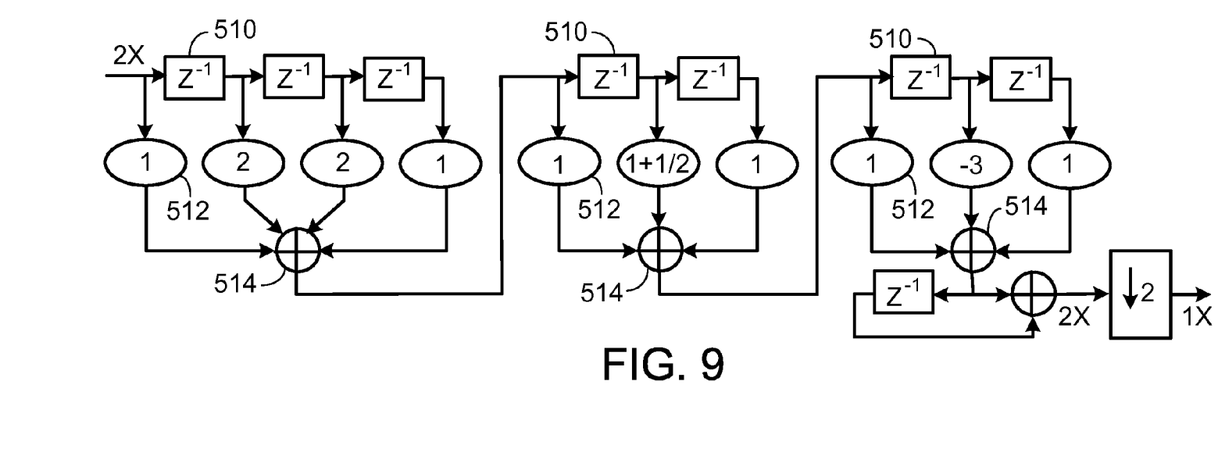
FIG. 9 is a block diagram of a 2× decimation filter in accordance with a seventh embodiment of the invention.

An example of an implementation of 2× decimation filters is shown in FIG. 9. As shown, the filter includes registers 510, coefficients 512 and adders 514. This filter includes 4 stages with each stage's impulse response being [1, 2, 2, 1], [1, 2½, 1], [1, −3, 1] and [1, 1] respectively. As one can see, the impulse responses are so simple that the implementation of such a filter requires no multiplications at all.

A 4× interpolation filter (from 2× to 8× for example) may be implemented by concatenating two, identical or different, 2× interpolation filters. A 12× interpolation filter (from 2× to 24× for example) may be implemented by concatenating one 3× and two 2× interpolation filters. Similarly, a 4× decimation filter may be implemented by concatenating two, identical or different, 2× decimation filters.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A root-raised-cosine filter chain circuit having an output at a first data rate, the filter chain circuit comprising:
    a digital filter with programmable coefficients which operates at a second data rate that is lower than the first data rate; and
    an interpolation filter connected in series with the digital filter and after the digital filter in the filter chain circuit, the interpolation filter configured to increase the data rate from the second data rate to the first data rate, wherein the coefficients of the interpolation filter are selected to introduce controlled distortions, and wherein the programmable coefficients of the digital filter are selected to compensate for the controlled distortions introduced by the interpolation filter.

2. A root-raised-cosine filter chain circuit as defined in claim 1, wherein the digital filter comprises a modified Root-Raised-Cosine filter.

3. A root-raised-cosine filter chain circuit as defined in claim 1, wherein the digital filter is implemented in a digital processor and the interpolation filter is implemented in a mixed signal processor.

4. A root-raised-cosine filter chain circuit as defined in claim 1, wherein the second data rate is an integer multiple of a symbol or chip rate, the integer being greater than or equal to 2.

5. A root-raised-cosine filter chain circuit as defined in claim 1, wherein coefficients of the digital filter are selected also to compensate for characteristics of other components across the entire filter chain.

6. A root-raised-cosine filter chain circuit as defined in claim 1, wherein the digital filter includes a plurality of multipliers and the interpolation filter does not include any multiplier.

7. A root-raised-cosine filter chain circuit as defined in claim 1, wherein the first data rate is a multiple of a symbol rate in a wireless communication system.

8. A root-raised-cosine filter chain circuit as defined in claim 1, wherein the first data rate is a multiple of a chip rate in a wireless communication system.

9. A root-raised-cosine filter chain circuit as defined in claim 1, wherein the digital filter and the interpolation filter are located on a digital baseband processor of a wireless communication system.

10. A filter chain circuit as defined in claim 5 wherein the other components include at least one of an analog to digital converter (ADC), a decimation filter and an analog filter.

11. A filter chain circuit as defined in claim 1 wherein the coefficients of the interpolation filter are of the form $\pm 2^m \pm 2^n$, wherein m and n are positive or negative integers or zero.

12. A filter chain circuit as defined in claim 11 wherein at least some of the coefficients of the interpolation filter have values including 1, 1+½, 2−¼ and −3.

13. A root-raised-cosine filter chain circuit as defined in claim 1, further comprising an analog to digital converter (ADC) that provides a digital output at a third data rate wherein the third data rate is less than the first data rate and greater than the second data rate.

14. A root-raised-cosine filter chain circuit as defined in claim 13, further comprising a decimation filter, connected in series between the ADC and the digital filter, that decreases the data rate from the third data rate to the second data rate.

15. A method for filtering a signal in a root-raised-cosine filter chain circuit and providing an output at a first data rate, comprising:
    filtering the signal in a digital filter with programmable coefficients at a second data rate that is lower than the first data rate; and
    filtering the output of the digital filter in an interpolation filter that increases the data rate from the second data rate to the first data rate,
    wherein the coefficients of the interpolation filter are selected to introduce controlled distortions and wherein the programmable coefficients of the digital filter are selected to compensate for the controlled distortions introduced by the interpolation filter.

16. A method as defined in claim 15, wherein multiplications are not performed in the interpolation filtering step.

17. A method as defined in claim 15, further comprising programming the programmable coefficients of the digital filter.

18. A method as defined in claim 17, further comprising programming the programmable coefficients of the digital filter to also compensate for characteristics of other components across an entire filter chain.

19. A method as defined in claim 18, further comprising transmitting data between the digital filter and the interpolation filter at a relatively low data rate as compared to data rates at inputs of other digital filters in the filter chain.

20. A method as defined in claim 18 wherein the other components include at least one of an analog to digital converter (ADC), a decimation filter and an analog filter.

21. A root-raised-cosine filter chain circuit having an input at a first data rate, comprising:
    a decimation filter which receives the input at the first data rate and decreases the data rate from the first data rate to a second data rate that is lower than the first data rate, wherein the coefficients of the decimation filter are selected to introduce controlled distortions; and
    a digital filter with programmable coefficients connected in series with the decimation filter, wherein the digital filter operates at the second data rate,
    wherein the programmable coefficients of the digital filter are configured to compensate for the controlled distortions introduced by the decimation filter.

22. A root-raised-cosine filter chain circuit as defined in claim 21, wherein the digital filter comprises a modified Root-Raised-Cosine filter.

23. A root-raised-cosine filter chain circuit as defined in claim 21, wherein the digital filter is implemented in a digital processor and the decimation filter is implemented in a mixed signal processor.

24. A root-raised-cosine filter chain circuit as defined in claim 21, wherein the second data rate is an integer multiple of a symbol or chip rate, the integer being greater than or equal to 2.

25. A root-raised-cosine filter chain circuit as defined in claim 21, wherein the digital filter and the decimation filter are implemented on separate integrated circuits and wherein the decimation filter communicates with the digital filter at the lowest sampling rate which is an integer multiple of a symbol or chip rate.

26. A root-raised-cosine filter chain circuit as defined in claim 21, wherein coefficients of the digital filter are selected to also compensate for characteristics of other components across the entire filter chain.

27. A root-raised-cosine filter chain circuit as defined in claim 21, wherein the digital filter includes a plurality of multipliers and the decimation filter does not include any multiplier.

28. A root-raised-cosine filter chain circuit as defined in claim 21, wherein the first data rate is a multiple of a symbol rate in a wireless communication system.

29. A root-raised-cosine filter chain circuit as defined in claim 21, wherein the first data rate is a multiple of a chip rate in a wireless communication system.

30. A root-raised-cosine filter chain circuit as defined in claim 21, wherein the digital filter is located on a digital baseband processor of a wireless communication system and the decimation filter is located on an analog baseband processor of the wireless communication system.

31. A filter chain circuit as defined in claim 26 wherein the other components include at least one of an analog to digital converter (ADC), an interpolation filter and an analog filter.

32. A filter chain circuit as defined in claim 21 wherein the coefficients of the decimation filter are of the form $\pm 2^m \pm 2^n$, wherein m and n are positive or negative integers or zero.

33. A filter chain circuit as defined in claim 32 wherein at least some of the coefficients of the decimation filter have values including 1, 2, 1+½ and −3.

34. A root-raised-cosine filter chain circuit as defined in claim 21, further comprising an interpolation filter that increases the data rate from the second data rate to a third data rate wherein the third data rate is different from the first data rate.

35. A method for filtering an input signal in a root-raised-cosine filter chain circuit at a first data rate, comprising:
   filtering the input signal in a decimation filter that decreases the data rate from the first data rate to a second data rate that is lower than the first data rate; and
   filtering the output of the decimation filter in a digital filter with programmable coefficients at the second data rate, wherein the coefficients of the decimation filter are selected to introduce controlled distortions and wherein the programmable coefficients of the digital filter are selected to compensate for the controlled distortions introduced by the decimation filter.

36. A method as defined in claim 35, wherein multiplications are not performed in the decimation filtering step.

37. A method as defined in claim 35, further comprising programming the programmable coefficients of the digital filter.

38. A method as defined in claim 37, further comprising programming the programmable coefficients of the digital filter to also compensate for characteristics of other components across an entire filter chain.

39. A method as defined in claim 38, further comprising transmitting data between the decimation filter and the digital filter at a relatively low data rate as compared to data rates at inputs of other digital filters in the filter chain.

40. A method as defined in claim 38 wherein the other components include at least one of an analog to digital converter (ADC), an interpolation filter and an analog filter.

41. A root-raised-cosine filter chain circuit having an output at a first data rate, the filter chain circuit comprising:
   a digital filter with programmable coefficients which operates at a second data rate that is lower than the first data rate;
   a timing adjustment module connected in series with the digital filter to decrease the second data rate received from the digital filter to a third data rate; and
   an interpolation filter connected in series with the timing adjustment module and after the digital filter in the filter chain circuit, the interpolation filter configured to increase the data rate from the third data rate to the first data rate, wherein the coefficients of the interpolation filter are selected to introduce controlled distortions, and wherein the programmable coefficients of the digital filter are selected to compensate for the controlled distortions introduced by the interpolation filter.

42. A root-raised-cosine filter chain circuit as defined in claim 41 wherein the timing adjustment module and the digital filter are implemented on a digital integrated circuit and the interpolation filter is implemented on a mixed signal integrated circuit.

43. A root-raised-cosine filter chain circuit as defined in claim 42 wherein the digital filter communicates with the interpolation filter at the lowest sampling rate which is an integer multiple of a symbol or chip rate.

44. A root-raised-cosine filter chain circuit as defined in claim 41, wherein the digital filter is located on a digital baseband processor of a wireless communication system and the interpolation filter is located on a mixed signal baseband processor of the wireless communication system.

45. A root-raised-cosine filter chain circuit as defined in claim 41, wherein a digital to analog converter (DAC) is connected to the output of the filter chain.

46. A root-raised-cosine filter chain circuit as defined in claim 45, wherein the programmable coefficients of the digital filter are also selected to compensate for the distortions introduced by the DAC.

* * * * *

UNITED STATES PATENT AND TRADEMARK OFFICE
CERTIFICATE OF CORRECTION

PATENT NO. : 8,417,750 B2
APPLICATION NO. : 11/249930
DATED : April 9, 2013
INVENTOR(S) : Aiguo Yan and Ayman Shabra Page 1 of 1

It is certified that error appears in the above-identified patent and that said Letters Patent is hereby corrected as shown below:

On Title Page 2, Column 1, Item (56)
Other Publications, Line 1, delete "Internation" and insert -- International --
Other Publications, Line 6, before "lpg=" delete second occurrence of "PA321&"

Signed and Sealed this
Second Day of July, 2013

Teresa Stanek Rea
*Acting Director of the United States Patent and Trademark Office*